United States Patent
De Nardi et al.

(10) Patent No.: US 10,528,133 B2
(45) Date of Patent: Jan. 7, 2020

(54) BRACELET IN A DISTRIBUTED ARTIFICIAL REALITY SYSTEM

(71) Applicant: Facebook Technologies, LLC, Menlo Park, CA (US)

(72) Inventors: Renzo De Nardi, Seattle, WA (US); Richard Andrew Newcombe, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 9 days.

(21) Appl. No.: 15/919,869

(22) Filed: Mar. 13, 2018

(65) Prior Publication Data

US 2019/0286232 A1     Sep. 19, 2019

(51) Int. Cl.
| | |
|---|---|
| *G06F 3/01* | (2006.01) |
| *G02B 27/01* | (2006.01) |
| *G06T 19/00* | (2011.01) |
| *G01R 33/022* | (2006.01) |

(52) U.S. Cl.
CPC ........... *G06F 3/014* (2013.01); *G01R 33/022* (2013.01); *G02B 27/017* (2013.01); *G06F 3/017* (2013.01); *G06T 19/006* (2013.01); *G02B 2027/0138* (2013.01); *G02B 2027/0178* (2013.01)

(58) Field of Classification Search
CPC ............... G01R 33/022; G02B 27/017; G02B 2027/0138; G02B 2027/0178; G06F 3/014; G06F 3/017; G06T 19/006
See application file for complete search history.

(56) References Cited

U.S. PATENT DOCUMENTS

| | | | | |
|---|---|---|---|---|
| 6,172,657 | B1 * | 1/2001 | Kamakura | G02B 27/017 345/8 |
| 6,571,193 | B1 * | 5/2003 | Unuma | A43B 3/0005 340/853.2 |
| 10,234,941 | B2 * | 3/2019 | Kim | G06F 3/014 |
| 2002/0024675 | A1 * | 2/2002 | Foxlin | G02B 27/017 356/620 |
| 2010/0199232 | A1 * | 8/2010 | Mistry | G06F 1/163 715/863 |
| 2011/0199296 | A1 * | 8/2011 | Simpson | G06F 3/014 345/157 |
| 2011/0199303 | A1 * | 8/2011 | Simpson | G06F 3/011 345/158 |
| 2012/0194644 | A1 | 8/2012 | Newcombe et al. | |
| 2012/0249409 | A1 | 10/2012 | Toney et al. | |
| 2013/0208234 | A1 | 8/2013 | Lewis | |
| 2013/0229261 | A1 | 9/2013 | Gates et al. | |

(Continued)

OTHER PUBLICATIONS

U.S. Appl. No. 15/487,361, filed Apr. 13, 2017, Inventors: Christopher David Twigg et al.

(Continued)

*Primary Examiner* — Mihir K Rayan
(74) *Attorney, Agent, or Firm* — Fenwick & West LLP

(57) ABSTRACT

A system includes an eyewear device configured to present content to a user. A processor is communicatively coupled to the eyewear device. A bracelet device includes a first tracking sensor configured to determine a position signal in response to movement of the user's hand. The bracelet device is communicatively coupled to the processor. The processor determines a pose of the user's hand based in part on the position signal.

20 Claims, 5 Drawing Sheets

(56) References Cited

U.S. PATENT DOCUMENTS

| | | | |
|---|---|---|---|
| 2013/0265220 A1* | 10/2013 | Fleischmann | G06F 3/011 |
| | | | 345/156 |
| 2014/0267701 A1* | 9/2014 | Aviv | G01C 11/025 |
| | | | 348/136 |
| 2015/0019227 A1 | 1/2015 | Anandarajah | |
| 2015/0188997 A1 | 7/2015 | Park et al. | |
| 2015/0227245 A1* | 8/2015 | Inagaki | G06F 3/0412 |
| | | | 345/173 |
| 2015/0258431 A1* | 9/2015 | Stafford | A63F 13/213 |
| | | | 463/31 |
| 2016/0223578 A1* | 8/2016 | Klosinski, Jr. | G01C 21/08 |
| 2016/0334877 A1 | 11/2016 | Yousefi et al. | |
| 2018/0032125 A1 | 2/2018 | Peterson et al. | |

OTHER PUBLICATIONS

U.S. Appl. No. 15/704,190, filed Sep. 14, 2017, Inventors: Hee Yoon Lee et al.

U.S. Appl. No. 15/644,203, filed Jul. 7, 2017, Inventors: Nicholas Daniel Trail et al.

U.S. Appl. No. 15/372,779, filed Dec. 8, 2016, Inventor: Nicholas Daniel Trail.

United State Office Action, U.S. Appl. No. 15/919,887, dated Apr. 4, 2019, 12 pages.

United States Office Action, U.S. Appl. No. 15/919,887, dated Jul. 26, 2019, 9 pages.

\* cited by examiner

BRACELET IN A DISTRIBUTED ARTIFICIAL REALITY SYSTEM

BACKGROUND

The present disclosure generally relates to artificial reality systems, and specifically to distributed artificial reality systems with bracelet devices.

Augmented reality (AR) systems and environments allow a user to directly or indirectly view a real world environment augmented by generated sensory input, which may be superimposed on the real world environment. Sensory input can be any form of media, such as sound, video, graphics, etc. Typically, an AR system includes a headset that provides visual and audio information to the user. Because AR systems allow for users to continue to engage with their real world environments in addition to a generated one, users may have less tolerance for large AR headset devices, as opposed to a virtual reality (VR) system in which the user is typically immersed in a fully generated environment. Additionally, smaller form factors facilitate all-day or longer use of artificial reality systems by reducing the friction between a user's experience of his or her environment and the artificial reality system itself.

However, the reduced form factor of AR systems produces challenges for providing sufficient power and computation, and limits the capacity for adding additional features that may enhance the user's AR experience and facilitate the interaction of the AR system with the environment. Furthermore, hand gestures are an important way in which users interact with and indicate objects within their environment, but these are not captured by a headset device. Because of its limited field of view, a headset device may be unable to see a user's hands or capture the user's gestures in response to the simulated environment presented by the headset. Furthermore, conventional hand tracking systems focus primarily on simply capturing hand movements, rather than determining what a hand motion means in the context of the user's environment and other signals detected by the distributed system. More generally, distributed systems often fail to fully integrate different devices and leverage the ability of a distributed AR system to combine information captured by each of the devices in the system.

SUMMARY

A distributed system includes a bracelet device that tracks a user's hand motions with respect to the user's artificial reality environment. The bracelet device is one of several devices in a distributed artificial reality system, which combines sensing, processing and power storage across multiple devices. Other devices in the distributed system include an eyewear device and a neckband device. The distributed artificial reality system contextualizes a user's hand motions within the user's environment by providing an imaging device that detects objects and other features within a user's real-world environment. The artificial reality may be adjusted in response to the user's hand motion.

A system includes an eyewear device configured to present content to a user. A processor is communicatively coupled to the eyewear device. A bracelet device includes a first tracking sensor configured to determine a position signal in response to movement of the user's hand. The bracelet device is communicatively coupled to the processor. The processor determines a pose of the user' hand based in part on the position signal.

Figure 1:
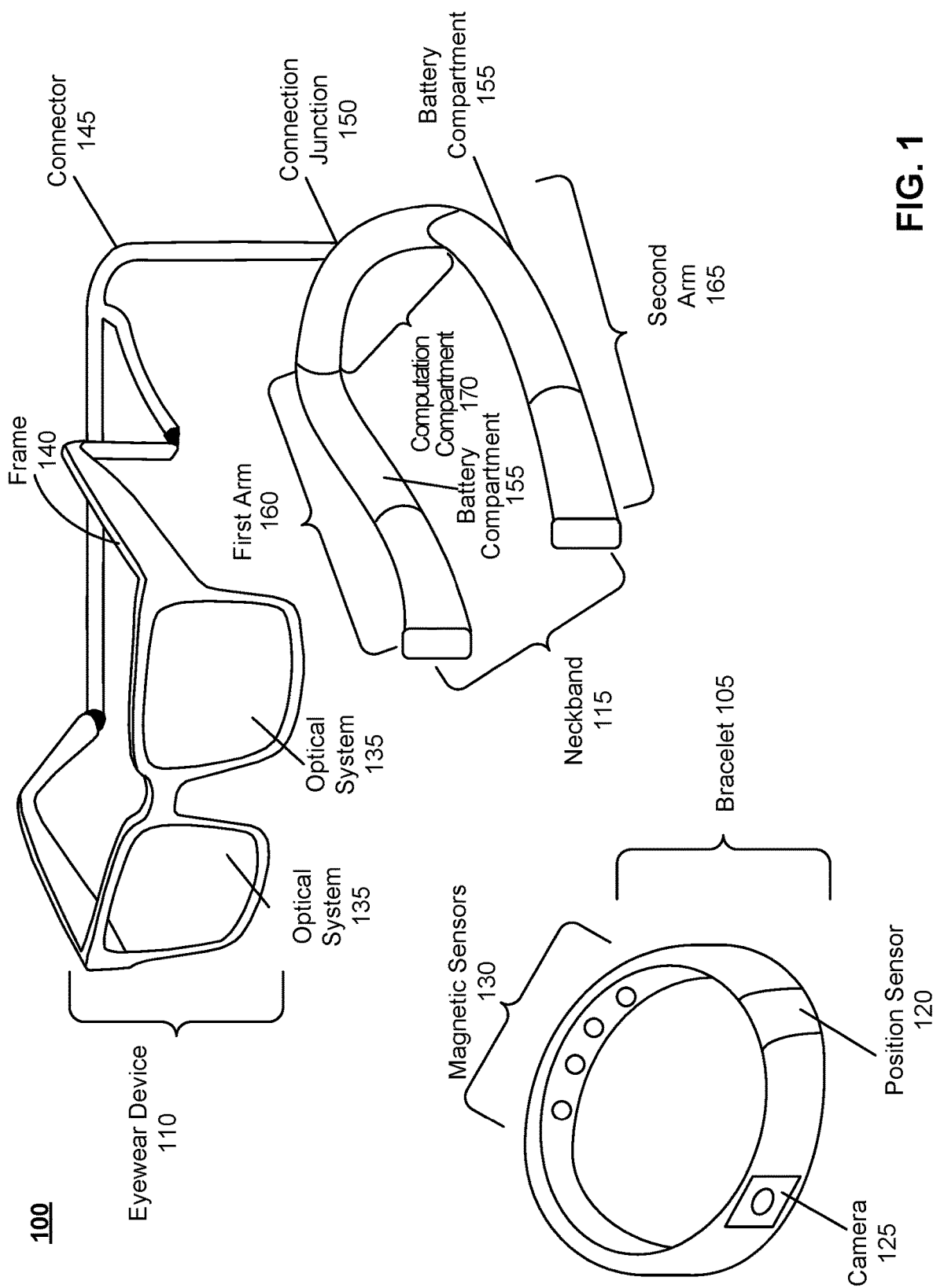
FIG. 1 is a diagram of a distributed artificial reality system, in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

AR and/or mixed reality (MR) devices allow a user to directly or indirectly view a real world environment augmented by generated sensory input, such as sound, video, graphics, etc. The generated sensory input may be superimposed on the real world environment, allowing the user to interact with both simultaneously. To allow the user to continue to view and interact with his or her real world environment while also perceiving the augmented environment, AR devices ideally provide a minimally invasive interface for the user that can be easily worn for long periods of time without interfering with the user's interactions with the environment. One category of AR, virtual reality (VR), and/or MR device designs includes a near-eye display (NED) with optical elements that provide the user with generated visual input such as graphics or video. A NED may be imbedded in an eyewear device in the form of eyeglasses, which rest on the bridge of a user's nose. However, to accommodate the reduced form factor of the NED as a pair of eyeglasses, computation, battery, and additional functions are moved off of the NED and onto separate linked devices. The result is a distributed AR system of multiple independent devices that together provide a full AR experience for the user.

Gestures and hand motions are important ways in which people interact with their real world environments. To determine how a user responds to an artificial reality, a distributed AR system can capture hand movements and translate them into gestures within and responsive to the generated artificial reality. Hand tracking systems, however, generally focus simply on detecting user hand motions, and don't necessarily combine these signals with the functionality of other devices within the distributed AR system. For example, a pointing gesture may have many possible meanings depending on the environment of the user; if there is an object in the real world, a user pointing to the object has a very different meaning than simply capturing that the user is making a pointing gesture. Thus determining gestures with respect to a user's real world environment is important to understanding how a user is interacting with the artificial reality that might be overlaid on top of it.

The present disclosure provides small form factor devices to present visual and audio content to a user and also track user hand gestures by distributing functions across several devices. The resulting distributed artificial reality system allows for hand tracking that detects a user's gestures with respect to the artificial and real world environment, providing context for the user's gestures not necessarily achievable by a hand tracking system alone. Thus the distributed AR system leverages signals collected across multiple devices to provide a more immersive artificial reality system that better responds to a user's interaction with the artificial reality.

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewer.

System Overview

FIG. 1 is a diagram of a distributed artificial reality system 100, in accordance with one or more embodiments. The distributed system 100 includes a bracelet 105, an eyewear device 110, and a neckband 115. In alternate embodiments, the distributed system 100 may include additional components (e.g., a mobile device as discussed in detail below with regard to FIGS. 4 and 5.

Bracelet

The bracelet 105 detects movement of a user's hand. The bracelet 105 includes a position sensor 120, a camera 125 and magnetic sensors 130. The bracelet 105 is shown as a circlet formed from a band with rounded edges. The bracelet 105 fits around the wrist of a user, which is shown in more detail with respect to FIG. 2. The bracelet 105 may be formed from any flexible material, such as an elastomer or other polymer material. The sizing of the bracelet 105 may be adjustable, such that the band size can be fit to the wrist of each individual user.

As shown, the bracelet 105 includes a position sensor 120. There may be any number of position sensors 120 located at various points on the bracelet 105. The one or more position sensors may be located external to an inertial measurement unit (IMU) (not shown), internal to an IMU, or some combination thereof. The position sensor 120 may be any sensor capable of determining a position of the bracelet 105 and generating a signal in response to movement of the bracelet 105. Since the bracelet 105 is worn on a user's wrist, the position sensors 120 therefore provide position signals that result from the movement of a user's arm. In some embodiments, the position sensor 120 tracks the position of the bracelet 105 over time, using a previous location data point to determine subsequent positions. In some embodiments, the position sensor 120 may be an accelerometer that measures translational motion (e.g., forward/back, up/down, left/right). Additionally or alternatively, the position sensor 120 is a gyroscope that measures rotational motion (e.g., pitch, yaw, and roll). In some embodiments, the multiple accelerometers and multiple gyroscopes located on the bracelet 105 together provide position signals indicating movement of the bracelet 105 in six degrees of freedom. The position sensor 120 may be a MEMS device.

The one or more position sensors 120 provide position signals to an IMU (not shown) which may be located on the bracelet 105, eyewear device 110, and/or neckband 115. The IMU uses the position signals from the one or more position sensors 120 to estimate a position of the bracelet 105. The IMU may estimate a relative position of the bracelet 105 with respect to the eyewear device 110, neckband 115, and/or any other device in a distributed artificial reality system 100, such as a mobile device as described FIGS. 4-5. In some embodiments, the IMU rapidly samples the measurement signals from the one or more position sensors 120 and calculates the estimated position of the bracelet 105 from the sampled data. For example, the IMU integrates the measurement signals received from the one or more position sensors 120 over time to estimate a velocity vector, and integrates the velocity vector over time to determine an estimated position of a reference point of the bracelet 105. Some or all of the computation for the IMU processing of the position signals from the one or more position sensors 120 may be carried out by the computation compartment 170 of the neckband 115, the eyewear device 110, a mobile device (not shown), or any other device in the distributed artificial reality system 100.

An IMU, computation compartment 170, or any other processor that determines position from the position sensor 120 may receive one or more calibration parameters from the bracelet 105. The one or more calibration parameters are used to maintain tracking of the bracelet 105. Based on a received calibration parameter, an IMU may adjust one or more IMU parameters (e.g., sample rate). The adjustment may be determined by the computation compartment 170 of the neckband 115, a processor of a mobile device, or any other processor of a device in the distributed artificial reality system 100. In some embodiments, certain calibration parameters cause the IMU to update an initial position of the reference point so it corresponds to a next calibrated position of the reference point. Updating the initial position of the reference point at the next calibrated position of the reference point helps reduce accumulated error associated with the determined estimated position of the bracelet 105. The accumulated error, also referred to as drift error, causes the estimated position of the reference point to "drift" away from the actual position of the reference point over time. In some examples, the IMU receives position information from both the one or more position sensors 120 on the bracelet 105 as well as position sensors (not shown) on the eyewear device 110 and position sensors (not shown) on the neckband 115.

As shown in FIG. 1, the bracelet 105 includes a camera 125. There may be one or more cameras 125 located on the bracelet 105. The one or more cameras 125 capture gesture information of a user's hand, as visible from the bracelet 105. Gesture information about the user's hand includes finger motions and pose, as well as palm motions pose. A gesture, pose, position or movement of a user's hand may be pointing, waving, or any other signal made by a user's hand. While the visual information may be captured by the one or more cameras 125, a hand gesture, pose or position of the user's hand may be determined from the visual information by a processor not physically located in the bracelet 105. The processor may be located on the neckband 115, eyewear device 110, or any other device in the distributed artificial reality system 100, such as a mobile device as described with reference to FIGS. 4-5. The visual information captured by the one or more cameras 125 may be used in a kinematic model of the hand, which relates visual detected movements of the user's hand to a hand gesture. The kinematic model may be machine learned, such that over time a model relating the movement information captured by the one or more cameras 125 is adapted to a user's hand gestures. The kinematic model may combine visual information collected from the one or more cameras 125 with other information from other sensors on the bracelet 105, eyewear device 110 and/or neckband 115. For example, the visual information from the camera 125 may be combined with movement information determined by the position sensor 120 and/or IMU. In other examples, the visual information from the camera 125 may be combined with visual information obtained from a camera located on the eyewear device 110 and/or neckband 115 (not shown). The kinematic model may be stored in a controller, or other software module (not shown). For example, the kinematic model may be stored in a mobile device, such as the mobile device described with reference to FIGS. 4-5. The processor communicates with the controller or software model and uses the kinematic model to determine a pose, gesture or hand signal from any of the signals from the camera 125, position sensor 120, magnetic sensors 130, or any other sensors located on the bracelet 105. The processor is located on the neckband 115, eyewear device 110, or any other device in the distributed artificial reality system 100, such as a mobile device as described with reference to FIGS. 4-5.

In some examples, the camera may be a depth camera assembly that collects depth image data of a user's hand. A hand tracking unit, located on any of the eyewear device 110, neckband 115, and/or a mobile device may include a neural network that uses the depth image data to determine a hand pose of the user's hand. Additional details regarding determining a pose, gesture, or other information about a user's hand may be found at, e.g., U.S. patent application Ser. No. 15/487,361, which is hereby incorporated by reference in its entirety.

The signals describing the movement of a user's hand as determined by the camera 125, one or more position sensors 120 and IMU are combined with the signals produced by the magnetic sensors 130 which measure a relative position of the bracelet 105 with respect to a background magnetic field. The magnetic sensors 130 may be located anywhere on the bracelet 105, and there may be any number of magnetic sensors 130 distributed on the bracelet 105. The magnetic sensors 130 may be magnetometers, MEMS magnetic field sensors, or any other magnetic sensor capable of detecting the direction, strength, and/or change in a magnetic field.

A baseline, background magnetic field exists in any environment in which the bracelet 105 operates, whether this be the result of the Earth's magnetic field or from the presence of other electronic devices in the environment that generate electromagnetic radiation. Regardless of the source, an ambient, background magnetic field exists in the environment, though it may have different directions and/or magnitudes. The magnetic sensors 130 measure a vector direction of the background magnetic field. When the bracelet 105 moves in response to movement of a user's arm, the vector direction measured by the magnetic sensors 130 changes in response to the new orientation of the bracelet 105 with respect to the background magnetic field. In some embodiments, it is assumed that the background magnetic field does not change in time, and thus that the detected changes in the magnetic field result from the movement of the bracelet 105. In some embodiments, the magnetic sensors 130 are 3D magnetometers and thus each detect changes in three degrees of freedom. In other embodiments, each magnetic sensor may be configured to generate a signal in response to changes in a single direction, so that to achieve three degrees of freedom, three different magnetic sensors 130 are configured to detect along three separate axes.

Together, the magnetic sensors 130 produce signals giving the gradient of the change in the measured magnetic field resulting from the bracelet 105 movement with respect to a stationary, background magnetic field. From this gradient, a velocity of the bracelet 105 may be determined, which may contain both rotational and linear velocity components. However, rotational velocity may be independently measured by the position sensors 120, such as by gyroscope position sensors 120. Thus combining the measurement from the magnetic sensors 130 with the known rotational measurement from the position sensors 120 allows for the linear velocity component of the gradient to be independently determined from the measured gradient. This linear velocity may thus be determined without being subject to error from drift in the integrated linear accelerometer and IMU measurement that may affect the accuracy of the position sensors 120. Similarly, the rotational component of velocity of the bracelet 105 may be determined from the gradient measured by the magnetic sensors 130 if the known linear velocity measured by accelerometer position sensors 120 is used to determine an unknown rotational velocity.

In some embodiments, measurements from any of the position sensor 120, camera 125 and magnetic sensors 130 may be combined into a kinematic model to determine a hand gesture, the position of the user's arm, and/or the position of the user's forearm. In some embodiments, measurements from any of the position sensor 120, camera 125, and magnetic sensors 130 may be used in a Simultaneous Localization and Mapping (SLAM) calculation, which may be carried out by the computation compartment 170 located on the neckband 115 and/or any other device in the distributed artificial reality system 100, such as a mobile device as described in FIGS. 4-5.

In some embodiments, the bracelet 105 includes a wireless gateway or directional antenna (not shown), located anywhere on the bracelet 105, through which it transmits and receives information from the eyewear device 110, neckband 115, and/or any other device in the distributed artificial reality system 100. The wireless connection between the bracelet 105, eyewear device 110 and/or neckband 115 may be a WiFi connection, a Bluetooth connection, or any other wireless connection capable of transmitting and receiving information. The wireless gateway may also connect the bracelet 105 to a mobile device, as described in further detail with reference to FIGS. 4-5. In other embodiments, the bracelet 105 is connected to the neckband 115, eyewear device 110, or any other device in a distributed artificial reality system, such as a mobile device, through a wired connection. In these examples, a wired connection may provide power to the bracelet 105 and/or transmit information from the bracelet 105 to a second device. For example, the battery compartments 155 in the neckband 115 may provide power to the bracelet 105 through a wired connection. The connecting wire may be retractable or otherwise adjustable in length.

In some embodiments, the bracelet 105 includes a battery compartment (not shown) through which any of the position sensor 120, camera 125 and magnetic sensors 130 are powered. The power source in the battery compartment may be re-chargeable. The power source in the battery compartment may be lithium ion batteries, lithium-polymer battery, primary lithium batteries, alkaline batteries, or any other form of power storage.

Eyewear Device

The eyewear device 110 provides content to a user of the distributed system 100. The eyewear device 110 includes two optical systems 135. The eyewear device 110 may also include a variety of sensors, such as one or more passive sensors, one or more active sensors, one or more audio devices, an eye tracker system, an IMU (not shown), or some combination thereof. As shown in FIG. 1, the eyewear device 110 and optical systems 135 are formed in the shape of eyeglasses, with the two optical systems 135 acting as eyeglass "lenses" within a frame 140. The frame 140 is attached to a neckband 115 by a connector 145, which connects to the neckband 115 by a connector junction 150.

Optical systems 135 present visual media to a user. Each of the optical systems 135 may include a display assembly. In some embodiments, when the eyewear device 110 is configured as an AR eyewear device, the display assembly also allows and/or directs light from a local area surrounding the eyewear device 110 to an eyebox (i.e., a region in space that would be occupied by a user's eye). The optical systems 135 may include corrective lenses, which may be customizable for a user's eyeglasses prescription. The optical systems 135 may be bifocal corrective lenses. The optical systems 135 may be trifocal corrective lenses.

The display assembly is used to present visual media to a user by generating image light with a projector and conveying the output light to a user's eye in an eyebox through any number of waveguides, gratings, light expansions, etc. The display assembly thus provides content through generated image light, which may be overlaid on top of a user's real-world environment. The display assembly may be composed of one or more materials (e.g., plastic, glass, etc.) with one or more refractive indices that effectively minimize the weight and widen a field of view of the eyewear device 110 visual system. In alternate configurations, the eyewear device 110 includes one or more elements between the display assembly and the eye. The elements may act to, e.g., correct aberrations in image light emitted from the display assembly, correct aberrations for any light source due to the user's visual prescription needs, magnify image light, perform some other optical adjustment of image light emitted from the display assembly, or some combination thereof. An element may include an aperture, a Fresnel lens, a convex lens, a concave lens, a liquid crystal lens, a liquid or other deformable surface lens, a diffractive element, a waveguide, a filter, a polarizer, a diffuser, a fiber taper, one or more reflective surfaces, a polarizing reflective surface, a birefringent element, or any other suitable optical element that affects image light emitted from the display assembly. Additional details describing an example of the display assembly may be found at, e.g., U.S. patent application Ser. No. 15/704,190, which is hereby incorporated by reference in its entirety.

Examples of media presented by the eyewear device 110 include one or more images, text, video, audio, or some combination thereof. The eyewear device 110 can be configured to operate, in the visual domain, as a VR NED, an AR NED, a mixed reality (MR) NED, or some combination thereof. For example, in some embodiments, the eyewear device 110 may augment views of a physical, real-world environment with computer-generated elements (e.g., images, video, sound, etc.). The eyewear device 110 may include a speaker or any other means of conveying audio to a user, such as bone conduction, cartilage conduction, etc.

The media presented by the eyewear device 110 may be adjusted in response to a user's hand gesture as detected by the bracelet 105. For example, the bracelet 105 may determine that a user is pointing to a virtual object in the visual artificial reality displayed in the eyewear device 110. In response, the view shown by the eyewear device 110 may zoom in on the object, display information about the object, bring the object into focus, or any other adjustment that responds to the user's gesture.

In other embodiments, the eyewear device 110 does not present media or information to a user. For example, the eyewear device 110 may be used in conjunction with a separate display, such as a coupled mobile device or laptop (not shown). In other embodiments, the eyewear device 110 may be used for various research purposes, training applications, biometrics applications (e.g., fatigue or stress detection), automotive applications, communications systems for the disabled, or any other application in which eye tracking or other sensing functions can be used.

The eyewear device 110 may include embedded sensors (not shown) such as 1-dimensional (1D), 2-dimensional (2D) imagers, or scanners for localization and stabilization of the eyewear device 110, as well as sensors for understanding the user's intent and attention through time. The sensors located on the eyewear device 110 may be used for SLAM calculations, which may be carried out in whole or in part by the processor embedded in the computation compartment 170 and/or a processor located in a coupled mobile device, as described in further detail with reference to FIGS. 4-5. Embedded sensors located on the eyewear device 110 may have associated processing and computation capabilities.

In some embodiments, the eyewear device 110 further includes an eye tracking system (not shown) for tracking a position of one or both eyes of a user. Note that information about the position of the eye also includes information about an orientation of the eye, i.e., information about user's eye-gaze. Based on the determined and tracked position and orientation of the eye, the eyewear device 110 adjusts image light emitted from one or both of the display assemblies. In some embodiments, the eyewear device 110 adjusts focus of the image light through the optical systems 135 and ensures that the image light is in focus at the determined angle of eye-gaze in order to mitigate the vergence-accommodation conflict (VAC). Additionally or alternatively, the eyewear device 110 adjusts resolution of the image light by performing foveated rendering of the image light, based on the position of the eye. Additionally or alternatively, the eyewear device 110 uses the information on a gaze position and orientation to provide contextual awareness for the user's attention, whether on real or virtual content. The eye tracker generally includes an illumination source and an imaging device (camera). In some embodiments, components of the eye tracker are integrated into the display assembly. In alternate embodiments, components of the eye tracker are integrated into the frame 140. Additional details regarding incorporation of eye tracking system and eyewear devices may be found at, e.g., U.S. patent application Ser. No. 15/644,203, which is hereby incorporated by reference in its entirety.

Computation for the eye-tracking system may be carried out by the processor located in the computation compartment 170 and/or a coupled mobile device, as described in further detail with reference to FIG. 4-5. The eyewear device 110 may include an IMU sensor (not shown) to determine the position of the eyewear device relative to a user's environment, as well as detect user movement. The IMU sensor may also determine the relative spatial relationship between the eyewear device 110 and the neckband 115, and/or the spatial relationship between the eyewear device 110 and the bracelet 105, which may provide information about the position of the user's head relative to the position of the user's body and hand. Here the neckband 115 may also include an IMU sensor (not shown) to facilitate alignment and orientation of the neckband 115 relative to the eyewear device 110. The IMU sensor on the neckband 115 may determine the orientation of the neckband 115 when it operates independently of the eyewear device 110. The eyewear device 110 may also include a depth camera assembly (DCA) (not shown), which may be a Time-of-Flight (TOF) camera, a Structured Light (SL) camera, a passive and/or active stereo system, and may include an infrared (IR) light source and detection camera. A DCA captures visual information of various depth zones of a scene of an area surrounding a device, such as the eyewear device 110. Additional details describing the DCA may be found at, e.g., U.S. patent application Ser. No. 15/372,779, which is hereby incorporated by reference in its entirety. The eyewear device 110 may include a variety of passive sensors, such as a red green and blue (RGB) color camera, passive locator sensors, etc. Cameras on the eyewear device 110 may supplement visual information about the user's hand, as determined by the one or more cameras 125 located on the bracelet 105. The eyewear device 110 may include a variety of active sensors, such as structured light sensors, active locators, etc. The number of active sensors may be minimized to reduce overall weight, power consumption and heat generation on the eyewear device 110. Active and passive sensors, as well as camera systems may be placed anywhere on the eyewear device 110.

Neckband

The neckband 115 is a wearable device that performs processing intensive operations offloaded to it from other devices (e.g., the bracelet 105, the eyewear device 110, a mobile device, etc.). As shown in FIG. 1, the neckband 115 is connected to the eyewear device 110 by the connection junction 150. The neckband 115 is wirelessly connected to the bracelet 105 through any standard wireless signal connection. The neckband 115 includes battery compartments 155 located on each of the first arm 160, second arm 165 and computation compartment 170. As shown, battery compartment 155 is embedded in both the first arm 160 and the second arm 165. As shown, a computation compartment 170 is connected to both the first arm 160 and the second arm 165.

Any of the above components may be located in any other part of the neckband 115. There may be any number of battery compartments 155 distributed across the neckband 115. There may be any number of computation compartments 170 distributed across the neckband 115. The battery compartment 155 and computation compartment 170 are preferably located such that weight is distributed evenly across the neckband 115, from left-to-right across the device symmetrical axis. Battery compartments may be located symmetrically across the device symmetrical axis, or may be asymmetrically distributed to balance out the weight of other sensors or compartments. For example, the battery compartments 155 may be located on the first arm 160 to balance out a computation compartment located on the second arm 165.

The neckband 115, composed of the first arm 160, the second arm 165 and the computation compartment 170, is formed in a "U" shape that conforms to the user's neck. The neckband 115 is worn around a user's neck, while the eyewear device 110 is worn on the user's head (not shown) as described in further detail with respect to FIG. 2. The first arm 160 and second arm 165 of the neckband 115 may each rest on the top of a user's shoulders close to his or her neck such that the weight of the first arm 160 and second arm 165 are carried by the user's neck base and shoulders. The computation compartment 170 may sit on the back of a user's neck. The connector 145 is long enough to allow the eyewear device 110 to be worn on a user's head while the neckband 115 rests around the user's neck. The connector 145 may be adjustable, allowing each user to customize the length of connector 145.

The power source in the battery compartment 155 may be in one or more sub-assemblies (with two as shown) where the unit embedded in the first arm 160 and/or the battery compartment 155 in the second arm 165 powers the eyewear device 110. Each battery compartment 155 houses a power source (e.g., batteries) which may be re-chargeable. The power source in the battery compartment 155 may be lithium ion batteries, lithium-polymer battery, primary lithium batteries, alkaline batteries, or any other form of power storage. If more than one battery sub-assembly is utilized, the battery compartment 155 of the first arm 160 may have a different battery or power capacity than the battery in the battery compartment 155 of the second arm 165. The computation compartment 170 may have its own power source (not shown) and/or may be powered by a power source in the battery compartments 155. Locating the battery compartments 155 on the neckband 115 distributes the weight and heat generated by the battery compartment 155 from the eyewear device 110 to the neckband, which may better diffuse and disperse heat, and also utilizes the carrying capacity of a user's neck base and shoulders. Locating the battery compartments 155, computation compartment 170 and any number of other sensors on the neckband 115 may also better regulate the heat exposure of each of these elements, as positioning them next to a user's neck may protect them from solar and environmental heat sources The computation compartment 170 houses a processor (not shown), which processes information generated by any of the sensors or camera systems on the bracelet 105, eyewear device 110 and/or the neckband 115. The processor of the computation compartment 170 is communicatively coupled to the eyewear device 110. The processor of the computation compartment 170 is communicatively coupled to the bracelet 105. The communication between the bracelet 105, eyewear device 110 and neckband 115 is described in further detail with reference to FIG. 3. The communication between the processor and either of the bracelet 105 and eyewear device 110 may be through any of the signals described with reference to FIG. 3. Information generated by the bracelet 105, eyewear device 110 and the neckband 115 may also be processed by a mobile device, such as the mobile device described in further detail with reference to FIGS. 4-5. A processor of a mobile device, such as the mobile device described in further detail with reference to FIGS. 4-5, may be communicatively coupled to the eyewear device 110 and/or the bracelet 105. The processor in the computation compartment 170 may process information generated by each of the bracelet 105, the eyewear device 110 and the neckband 115. The connector 145 conveys information between the eyewear device 110 and the neckband 115, and between the eyewear device 110 and the processor in the computation compartment 170. The bracelet 105 may convey information to the computation compartment 170 via a wireless gateway located on the bracelet 105 and neckband 115. The wireless gateway of the neckband 115 is described in further detail with reference to FIG. 5. In some examples, the first arm 160, and second arm 165 may also each have an embedded processor (not shown). In these examples, the connector 145 conveys information between the eyewear device 110 and the processor in each of the first arm 160, the second arm 165 and the computation compartment 170. In these examples, information received from the bracelet 105 through a wireless gateway may be distributed to each of the first arm 160, second arm 165 and the computation compartment 170 for processing. The information may be in the form of optical data, electrical data, or any other transmittable data form. Moving the processing of information generated by the bracelet 105 and eyewear device 110 to the neckband 115 reduces the weight and heat generation of the bracelet 105 and eyewear device 110, making them more comfortable to the user and encouraging user over longer time scales.

The processor embedded in the computation compartment 170 may compute all inertial and spatial calculations from IMU sensors located on the bracelet 105 and eyewear device 110. The processor embedded in the computation compartment 170 may compute all calculations from the active sensors, passive sensors, and camera systems located on the eyewear device 110, as well as the position sensor 120, camera 125 and magnetic sensors 130 on the bracelet 105. The processor embedded in the computation compartment 170 may perform all computations from information provided by any sensor located on the bracelet 105 and/or eyewear device 110. The processor embedded in the computation compartment 170 may perform all computation from information provided by any sensor located on the bracelet 105 and/or eyewear device 110 in conjunction with a processor located on a coupled external device, such as a mobile device as described in further detail with reference to FIGS. 4-5.

The neckband 115 may include a multifunction compartment (not shown). The multifunction compartment may be a customizable compartment in which additional feature units may be inserted and removed by a user. Additional features may be selected and customized by the user upon purchase of the neckband 115. Examples of units that may be included in a multifunction compartment are: an imaging device, a memory unit, a processing unit, a microphone array, a projector, a camera, etc. These may be described in further detail with reference to FIG. 5.

The computation compartment 170 and battery compartment 155 may be segments of the neckband 115 as shown in FIG. 1. However, computation compartments 170 and battery compartments 155 may also be any sub-structures of neckband 115, such as compartments embedded within neckband 115, compartments coupled to sensors embedded in neckband 115, and/or may be located anywhere on neckband 115.

In some examples, the connector 145 conveys information from the eyewear device 110 to the neckband 115. Sensors located on the eyewear device 110 may provide the processor embedded in the computation compartment 170 with sensing data, which may be processed by the processor in the computation compartment 170. The computation compartment 170 may convey the results of its computation to the eyewear device 110. For example, if the result of the processor in the computation compartment 170 is a rendered result to be displayed to a user, the computation compartment sends the information through the connector 145 to be displayed on the optical systems 135. In some examples, there may be multiple connectors 145. For example, one connector 145 may convey power, while another connector 145 may convey information.

In some examples, the connector 145 provides power to the eyewear device 110 through magnetic induction at the connector junctions (not shown) with the frame 140. In this example, the connector 145 may be coupled to the frame 140 with retention magnets. In other examples, the connector 145 provides power from the neckband 115 to the eyewear device 110 through any conventional power coupling technique. The connector 145 is flexible to allow for independent movement of the eyewear device 110 relative to the neckband 115. The connector 145 may be retractable, or otherwise adjustable to provide the correct length between the near-eye-display and the neckband 115 for each user, since the distance between a user's head and neck may vary.

In some examples, the eyewear device 110 is wirelessly coupled with the neckband 115. In these examples, the processor embedded in the computation compartment 170 receives information from the eyewear device 110 and the sensors and camera assemblies located on the eyewear device 110 through the wireless signal connection, and may transmit information back to the eyewear device 110 through the wireless signal connection. The wireless connection between the eyewear device 110 and the neckband 115 may be through a wireless gateway (not shown) or directional antenna, located in the first arm 160 and/or second arm 165 and/or on the eyewear device 110. The wireless connection between the eyewear device 110 and the neckband 115 may be a WiFi connection, a Bluetooth connection, or any other wireless connection capable of transmitting and receiving information. The wireless gateway may also connect the eyewear device 102 and/or the neckband 115 to a mobile device, as described in further detail with reference to FIGS. 4-5.

In some examples in which the eyewear device 110 is wirelessly coupled with the neckband 115, the connector 145 may only transmit power between the neckband 115 and the eyewear device 110. Information between the eyewear device 110 and neckband 115 would thus be transmitted wirelessly. In these examples, the connector 145 may be thinner. In some examples in which the eyewear device 110 is wirelessly coupled with the neckband 115, power may be transmitted between the eyewear device 110 and the neckband 115 via wireless power induction. Additionally or alternatively, power may be transmitted between the neckband 115 and the bracelet 105 via wireless power induction. In some examples, there may be a separate battery or power source located in the eyewear device 110. In some examples in which the eyewear device 110 is wirelessly coupled with the neckband 115, the addition of a connector 145 may be optional.

Interaction Between Devices in Distributed System

The visual component of the artificial reality generated by the optical systems 135 on the eyewear device 110 or the neckband 115 may change in response to movement of the user's hand as measured by the bracelet 105. Additionally or alternatively, audio components of an artificial reality, produced by either the eyewear device 110 or the neckband 115 may be adjusted in response to movements of the user's hand as measured by the bracelet 105. Any other component of the artificial reality generated by either the eyewear device 110 and/or the neckband 115 may be altered in response to a user's gestures or hand movement as measured by the bracelet 105. For example, the bracelet 105 may determine that a user is pointing to a virtual object that is displayed in the optical systems 135, and in response, the optical system 135 may zoom in on the object.

The bracelet 105, eyewear device 110 and neckband 115 architecture thus allows the user's artificial reality experience to be through small form factor devices, while still maintaining the processing and battery power necessary to provide a full artificial reality experience. Furthermore, the bracelet 105 allows the distributed artificial reality system 100 to determine a user's hand motions in response to the artificial reality displayed and generated through the eyewear device 110 and neckband 115. The form factor of the bracelet 105 can be reduced since its processing may be carried out by the neckband 115. The movement detected by the bracelet 105 can be further contextualized by combining user hand gestures with information about the user's real world environment, as determined by sensors located on the eyewear device 110 and/or neckband 115. This is described in further detail with respect to FIG. 3.

Distributed Artificial Reality System and a User

Figure 2:
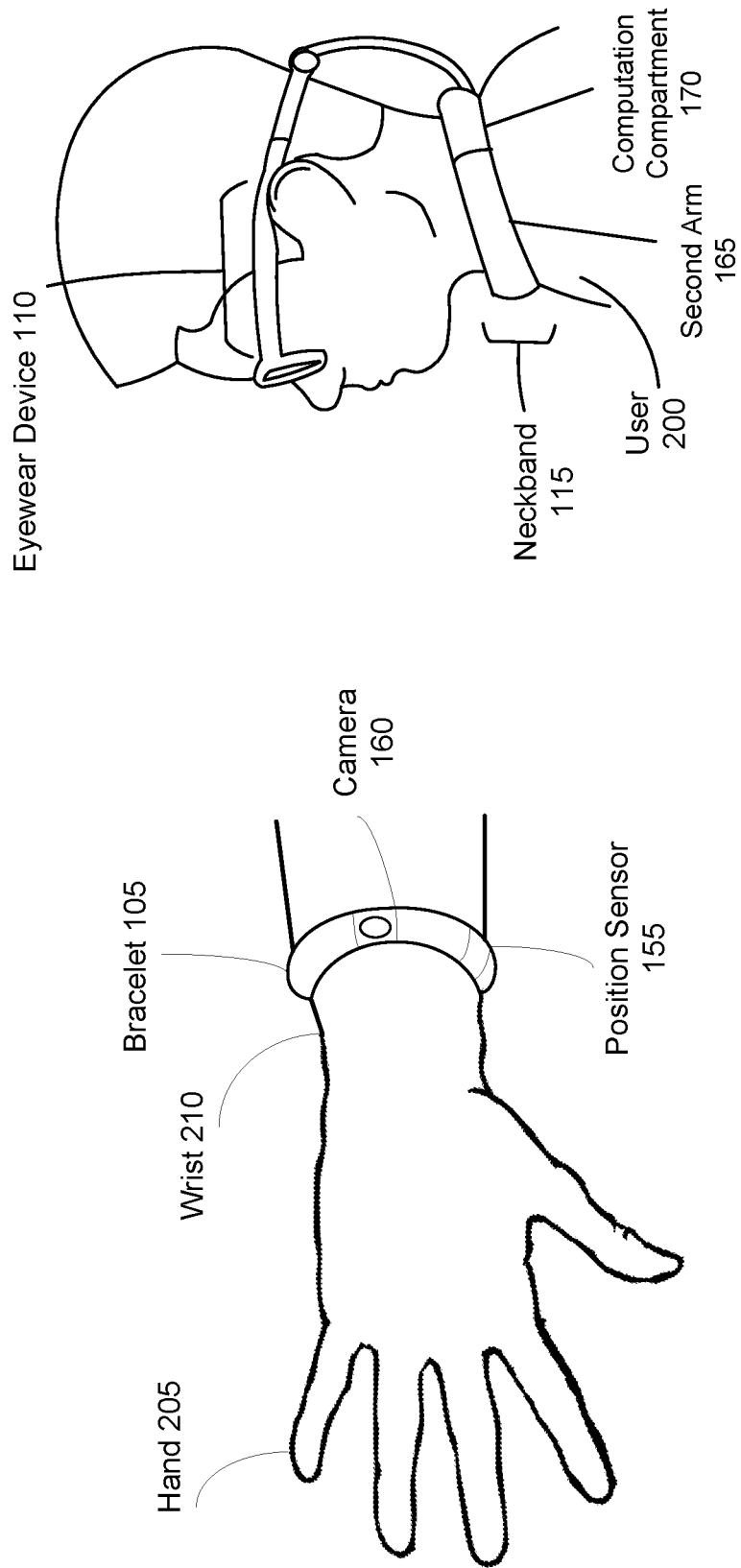
FIG. 2 is a diagram of a distributed artificial reality system worn by a user, in accordance with one or more embodiments.

FIG. 2 is a diagram of a distributed artificial reality system being worn by a user, in accordance with one or more embodiments. The user 200 wears the bracelet 105 close to his or her hand 205. The bracelet 105 conforms to the shape of the user 200's wrist. The user 200 wears the eyewear device 102 on his or her head like a pair of eyeglasses. The neckband 115 is shown around the user neck 210, such that the computation compartment 130 is on the back of the user neck 210 and the second arm 165 rests on the side of the user neck 210. Thus the weight of the neckband 115 is distributed to the user's shoulders, and the neckband 115 is conformed to the shape of the user neck 210.

The bracelet 105 conforms to the user's wrist so that movement of the user's hand 205 and/or arm (not shown) do not result in shifting of the sensors on the bracelet 105 with respect to the hand 205. The camera 125 may be secured so that the user's hand 205 is in line of sight of the camera 125. The magnetic sensors (not shown), combined with the position sensor 120 and camera 125 may collectively measure movements of the user's hand 205 and convey the measurements to the computation compartment 170 of the neckband 115. Since the user may tolerate a heavier load on their shoulders, weight of components that might otherwise be located on the bracelet 105 and/or eyewear device 110 may be shifted to the neckband 115, facilitating freer movement of the user's hand 205.

Hand Tracking in the Context of a Local Environment

Figure 3:
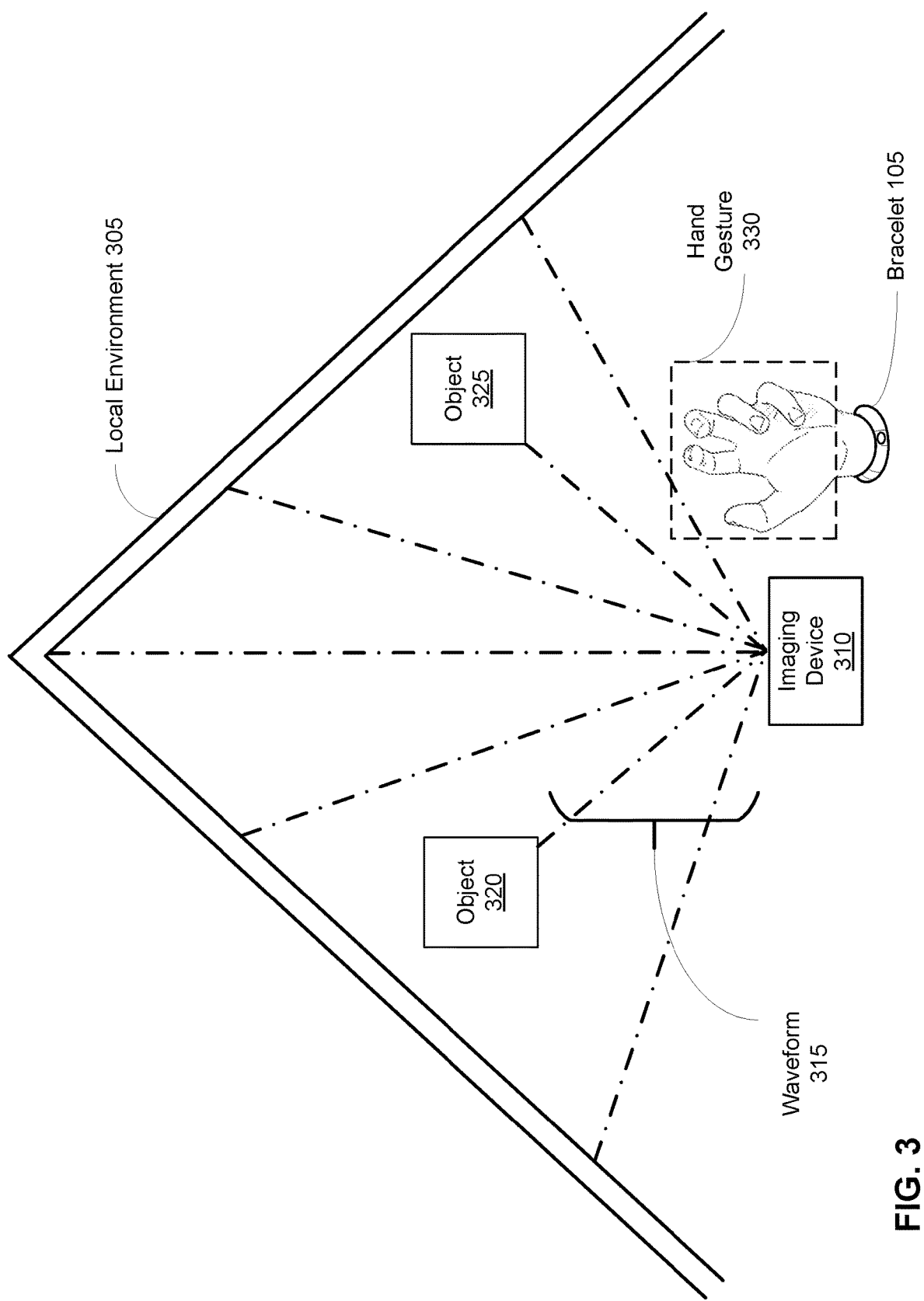
FIG. 3 is a diagram of an imaging device of a distributed artificial reality system in a local environment, in accordance with one or more embodiments.

FIG. 3 is a diagram of an imaging device 310 of a distributed artificial reality system in a local environment 305, in accordance with one or more embodiments. The imaging device 310 may be a DCA, which collects information about a user's local environment 305. The imagining device 310 may be located on either the eyewear device 110 and/or the neckband 115. The imaging device 310 includes one or more sources and one or more light sensors (e.g., a camera, a video camera). The light source illuminates the local environment, which allows the imagining device 310 to detect the presence of objects (e.g., objects 320 and 325, a user's hands, etc.) in the local environment. The bracelet 105 tracks a user's hand and determines a hand gesture 330 with respect to the local environment 305 and the detected objects 320 and 325. As referred to herein, a hand gesture 330 may also be referred to as a pose of a user's hand, a position of a user's hand, or a hand movement.

The imaging device 310 emits a waveform 315 into the local environment 305. The wavelength of the waveform 315 may be in a visible band (~380 nm to 750 nm), an infrared (IR) band (~750 nm to 1500 nm), an ultraviolet band (10 nm to 380 nm), another portion of the electromagnetic spectrum, or some combination thereof. The light sensors may be sensitive to the same range of wavelengths emitted as the waveform 315. The light sensors may also be sensitive to light having visible wavelengths as well as the light emitted as the waveform 315. For example, the light sensors may be red, green, blue, IR (RGBI) cameras. In some embodiments, the light sensors may be a camera in addition to a complementary metal-oxide-semiconductor (CMOS) imager, other light sensitive device, or some combination thereof.

The light sensors of the imaging device 310 detect the presence of objects (e.g., the objects 320 and 325, the user's hands, etc.) in the local environment 305. For example, the waveform 315 emitted into the local environment 305 reflects off of the objects 320 and 325. In addition to the reflected waveform 315, objects 320 and 325 reflect incident ambient light that may be collected by the light sensors of the imaging device 310. The reflected ambient and waveform 315 light is collected by the light sensors and compared to the emitted waveform 315 to determine characteristics of objects 320 and 325 such as the distance of objects 320 and 325 from the imaging device 310, the shape of the objects 320 and 325, the surface texture of the objects 320 and 325, etc. In some examples, the waveform 315 is structured light (SL), which may be in any SL pattern, such as a symmetric or quasi dot pattern, grid, horizontal bars, etc. The imaging device 310 compares the emitted SL to the structure of the reflected light to detect the characteristics of objects 320 and 325. In some embodiments, the imaging device 310 may use Time of Flight (ToF) depth determination techniques in which, e.g., the characteristics of objects 320 and 325 are determined from a time delay between the emitted waveform 315 and a detected reflection of a portion of the waveform 315 off of the objects 320 and 325. In some embodiments, the imaging device 310 may use stereo imaging techniques, in which the characteristics of objects 320 and 325 are determined through a stereo image. Additionally, in some embodiments, one or more depth determination techniques may be combined to determine depth information for objects (e.g., the object 320, the object 325, a user's hands, etc.) in the local environment 305. Any other depth sensing may be used by the imaging device 310 to determine the characteristics of objects 320 and 325 and/or a hand of the user. In some embodiments, the imaging device 310 does an initial scan of waveform 315 in the local environment 305 to detect objects 320 and 325, and then selectively emits a second set of waveform 315 localized around the detected objects 320 and 325.

Figure 4:
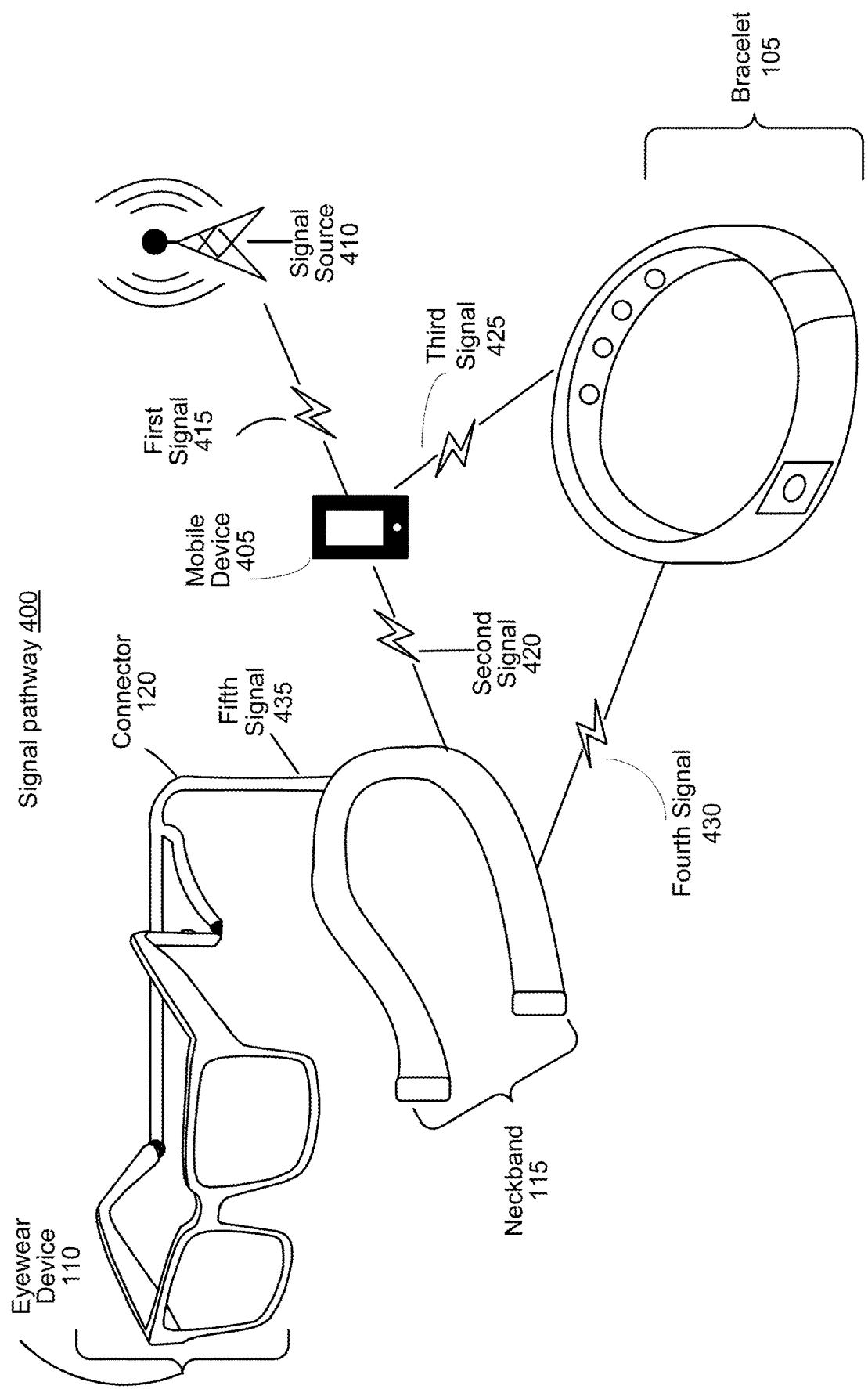
FIG. 4 is a diagram of signal communications in a distributed artificial reality system, in accordance with one or more embodiments.
Figure 5:
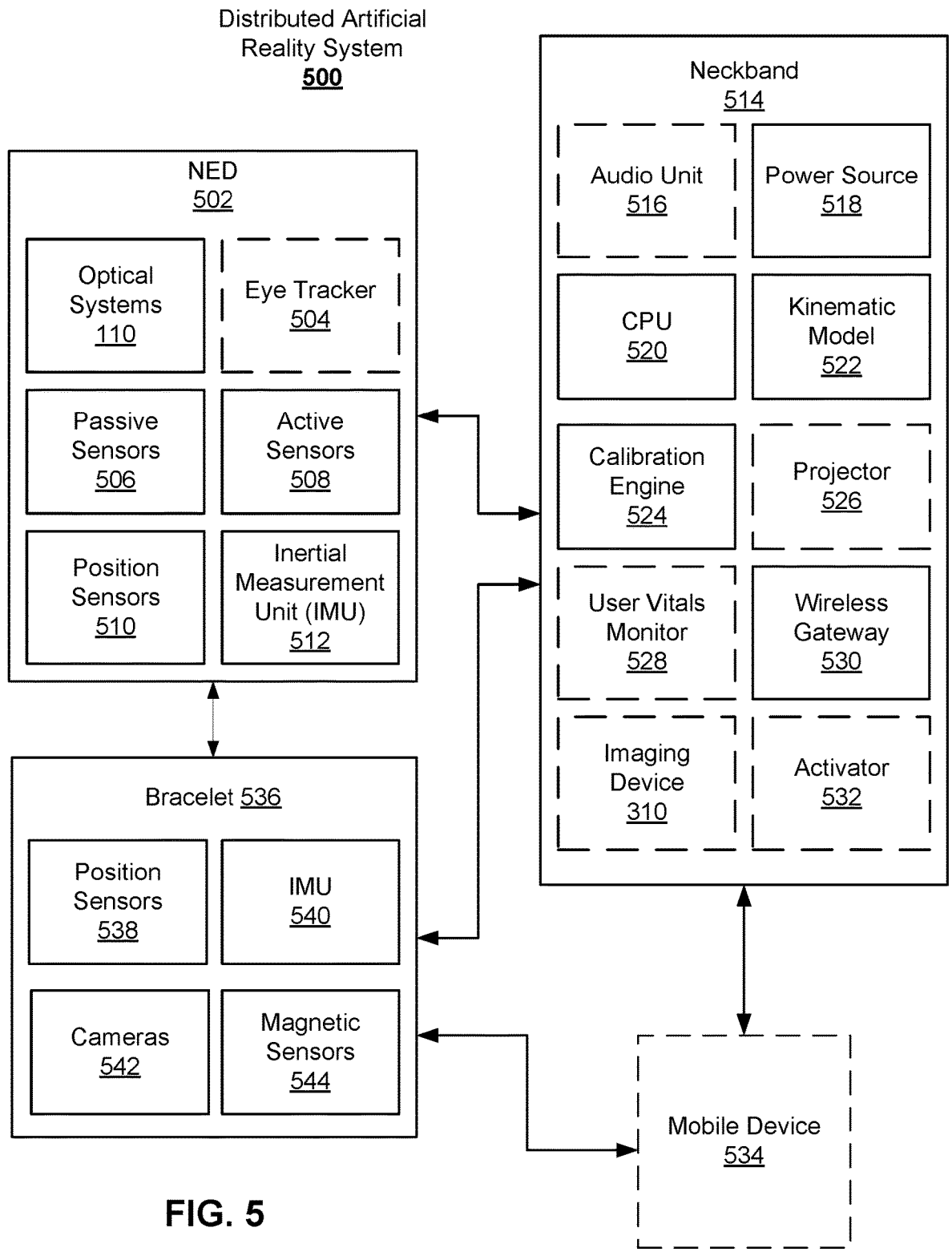
FIG. 5 is a block diagram of a distributed artificial reality system, in accordance with one or more embodiments.

The imaging device 310 conveys the collected information about objects 320 and 325 and conveys them to a processor of a distributed artificial reality system, such as a processor in the computation compartment 170 of the neckband 115, the processor of a mobile device, such as mobile device 405 or 534 as shown in FIGS. 4-5, or any other processor in any other device in the distributed artificial reality system. The processor also receives a number of visual signals from the camera 125, position signals from the position sensor 120, orientation signals from the magnetic sensors 130, or any other signals from a bracelet 105 that together may indicate a hand gesture 330. The processor determines the hand gesture 330 from any of the signals received from the bracelet 105. The imaging device 310 is thus communicatively coupled to a processor in a distributed artificial reality system, which may be through any wired or wireless signal.

The processor combines information about the objects located in the local environment 305 as determined by the imaging device 310 with the hand gesture 330. The hand gesture 330 is determined by the processor from sensor information conveyed to the processor from sensors located on the bracelet 105. In some instances the information about the objects located in the local environment 305 may also include depth information about one or more of the user's hands. The processor may determine if the hand gesture 330 refers to any of the objects detected in the local environment 305. For example, the processor may determine if a hand gesture 330 indicates the user's interaction with the objects, such as if the hand gesture 330 is pointing at an object in the local environment 305. The processor thus interprets the user's hand gesture 330 as determined by the processor from sensor information provided by any number of sensors located on the bracelet 105 within the context of the local environment 305 as determined by the imaging device 310. In some examples, the processor uses information about the objects located in the local environment 305 to determine a hand gesture 330. The processor may combine signals received from the bracelet 105 with information about objects received from the imaging device 310 to determine a hand gesture 330. For example, if the sensors on the bracelet 105 indicate that the bracelet 105 is aligned with an object detected by the imaging device 3101, the processor may use this information to determine that the user is pointing at the object, and thus that the hand gesture 330 is a pointing hand gesture.

In response to relating the hand gesture 330 to the detected objects, the processor may adjust the artificial reality provided to the user through any of the bracelet 105, eyewear device 110 and/or neckband 115. For example, if the processor determines that the hand gesture 330 is pointing at object 320, it may instruct the eyewear device 110 to display information to a user about object 320. For example, if object 320 is a book that the hand gesture 330 is pointing at, then the eyewear device 110 may display to a user recent reviews about the book, books by the same author, a preview of the book, etc.

Thus by combining detection by the imaging device 310 and bracelet 105, the distributed artificial reality system is able to contextualize the hand gesture 330 and provide feedback to a user within the artificial reality environment in response to the hand gesture 330.

Signal Pathways in a Distributed System

FIG. 4 is a diagram of a signal pathway 400, in accordance with one or more embodiments. In signal pathway 400, a signal source 410 sends a first signal 415 to a mobile device 405. The mobile device sends a second signal 420 to the neckband 115. The mobile device also sends a third signal 425 to a bracelet 105. The bracelet 105 sends a fourth signal 430 to the neckband 115. This signal pathway may be reversed, such that the neckband 115 sends the fourth signal 430 to the bracelet 105 and/or the bracelet 105 sends the third signal 425 to the mobile device 405. The connector 145 communicates a fifth signal 435 to the eyewear device 110. This signal pathway may be reversed, such that the eyewear device 110 sends a fifth signal 435 to the neckband 115 through the connector 145, the neckband 115 sends a second signal 420 to the mobile device 405, and the mobile device sends a first signal 415 to the signal source 410. First, second, third, fourth and fifth signals 415, 420, 425, 430 and 435, respectively, may be transmitted and received in any order. They are described in FIG. 4 as "first," "second," "third," "fourth," and "fifth" for illustrative purposes only.

The signal source 410 is a wireless signal source, which may be capable of linking the mobile device 405 to the internet via the cellular network of signal source 410. In some examples, the signal source 410 is a cellular network. The signal source may be from any combination of local area and/or wide area networks, using both wired and/or wireless communication systems. The signal source 410 may use standard communication technologies and/or protocols to send first signal 415. Signal 415 may be sent using technologies such as Ethernet, 802.11, worldwide interoperability for microwave access (WiMAX), 3G, 4G, 5G, code division multiple access (CDMA), digital subscriber line (DSL), etc. In some examples, the mobile device may be any device having computer functionality, such as a personal digital assistant (PDA), a smartphone, a laptop, tablet, or another suitable device. Mobile device 405 is configured to communicate with the signal source 410, bracelet 105 and the neckband 115. In some embodiments, the neckband 115 and/or bracelet 105 communicates directly with the signal source 410, such that the first signal 415 sent from the signal source 410 is sent directly to the neckband 115 and/or bracelet 105.

The mobile device 405 communicates the second signal 420 to the neckband 115 and the third signal 425 to the bracelet 105. The second signal 420 and third signal 425 may be wired or wireless signals. The mobile device 405 may have an application used to control the artificial reality environment produced by the bracelet 105, neckband 115 and/or eyewear device 110. The application may be run on any mobile device operating system, such as an IOS operating system, an ANDROID operating system, etc. The application on the mobile device 605 may control other features on the bracelet 105, neckband 115 and eyewear device 110, such as turning ON or OFF a voice command feature, adjusting volume, brightness, etc. The application on the mobile device 405 may allow for personalized settings of the bracelet 105, neckband 115 and eyewear device 110.

The mobile device 405 may serve as an additional processor to the processor located in the computation compartment of neckband 115. Through either of the second or third signals 420 and 425, the processor of the mobile device 405 is communicatively coupled to each of the neckband 115 and the bracelet 105. In some examples, the eyewear device 110 may be communicatively coupled to the processor of the mobile device 405 through the fifth and second signals 435 and 420. In other examples, the eyewear device 110 is communicatively coupled to the processor of the mobile device 405 through a direct signal (not shown) between the eyewear device 110 and the mobile device 405 through a wireless signal. The wireless signal between the eyewear device 110 and the mobile device 405 may be a Bluetooth signal, Wi-Fi signal, or any other suitable wireless signal. The mobile device may process information from the bracelet 105, eyewear device 110 and/or the neckband 115. The mobile device 405 may have wired or wireless communication with neckband 115, depending on if there are latency issues with the receipt or transmittal of processing information. In some examples, the mobile device 405 may serve as a battery backup for the battery compartments located on the neckband 115. In some examples, the neckband 115 receives information about sensors on the eyewear device 102 from the mobile device 405.

The second, third, fourth and fifth signals 420, 425, 430, 435, respectively, may be a wireless signal, such as a Bluetooth signal, Wi-Fi signal, or any other suitable wireless signal. In some examples, the second, third, fourth and fifth signals 420, 425, 430, 435, respectively, may be an electric, magnetic or optic signal conveyed through a wire, or any other non-wireless signal. The second signal 620 may thus be information from the neckband 115 conveyed to the mobile device 405, or information from the mobile device 405 to the neckband 115. This information may be processed by the mobile device 405.

The mobile device 405 is thus coupled to the neckband 115 by at least the second signal 420. A projector on the neckband 115 may project an image, video, or any visual content onto the screen of the mobile device 405. The mobile device 405 may thus serve as an additional artificial reality device, onto which an artificial reality environment can be projected from the neckband 115. The mobile device 405 may operate with the bracelet 105 and/or neckband 115 only, such that the eyewear device 102 is not included in the user's artificial reality experience and the artificial reality environment is entirely generated by the neckband 115 and mobile device 405, or the bracelet 105 and the mobile device 405.

In some examples, the camera on the mobile device 405 may have a 3D user capture feature, allowing the user's body to be 3-dimensionally rendered and tracked. The camera on the mobile device may provide a 3D depth map of a user's face. The imaging device 310 may be located on the mobile device 405. In some examples, the mobile device 405 includes a separate imaging device that augments the information about the local environment 305 as determined by the imaging device 310. For example, the mobile device 405 may have a passive camera or active camera including a depth camera assembly, capable of scanning a room or otherwise mapping a user's environment. The camera assembly may be a TOF system, SL system, mono or stereo vision (passive and/or active), or any other system capable of producing a depth map. The camera assembly may provide a fully 3D description of the user's environment, such as a room in which a user is standing in or other physical structures around the user. The camera on the mobile device 405 may provide 3D information to the bracelet 105, neckband 115 and/or eyewear device 102.

The mobile device 405 may also have an audio and/or visual streaming feature, allowing the user to perceive audio/visual information that may supplement the artificial reality environment produced by the bracelet 105, neckband 115 and/or eyewear device 102. The mobile device 405 may include a haptic feature, wherein the user's physical interaction with the mobile device 405 is translated as a command to the bracelet 105, neckband 115 and/or eyewear device 102.

The mobile device 405 may thus supplement the artificial reality environment provided by the bracelet 105, eyewear device 102 and/or neckband 115.

In addition to communicating through the mobile device 405, the bracelet 105 may communicate directly to the neckband 115 through the fourth signal 430. Fourth signal 430 may be a wireless signal, such as a Bluetooth signal, Wi-Fi signal, or any other suitable wireless signal. In some examples, the fourth signal 430 may be an electric, magnetic or optic signal conveyed through a wire, or any other non-wireless signal. The fourth signal 430 may thus be information from the neckband 115 conveyed to the bracelet 105, or information from the bracelet 105 to the neckband 115. This information may be processed by the neckband 115. For example, the bracelet 105 may communicate hand gesture 330 through the fourth signal 430 to the neckband 115.

Distributed Artificial Reality System

FIG. 5 is a block diagram of a distributed artificial reality system 500, in accordance with one or more embodiments. The distributed artificial reality system 500 includes a bracelet 536, NED 502, a neckband 514, and a mobile device 534. The bracelet 536 is connected to the NED 502, neckband 514 and the mobile device 534. The bracelet 536 may be the bracelet 105 as described in FIGS. 1-4. The neckband 514 is connected to the bracelet 536, the NED 502 and the mobile device 534. The neckband 514 may be the neckband 115 as described in FIGS. 1-2 and 4. The NED 502 may be the eyewear device 110 as shown in FIGS. 1-2 and 4. The mobile device 534 may be the mobile device 405 as shown in FIG. 4. In alternative configurations of system 500, different and/or additional components may be included. The system 500 may operate in a VR system environment, an AR system environment, an MR system environment, or some combination thereof.

The NED 502 includes optical systems 135, as described with reference to FIG. 1. The NED 502 may also include an eye tracker 504, one or more passive sensors 506, one or more active sensors 508, one or more position sensors 510, and an Inertial Measurement Unit (IMU) 512. The eye tracker 504 may be an optional feature of the NED 502.

The eye tracker 504 tracks a user's eye movement. The eye tracker 504 may include at least a dichroic mirror, for reflecting light from an eye area towards a first position, and a camera at the position at which the light is reflected for capturing images. Based on the detected eye movement, the eye tracker 504 may communicate with the bracelet 536, neckband 514, CPU 520 and/or mobile device 534 for further processing. Eye tracking information collected by the eye tracker 504 and processed by the CPU 520 of the neckband 514 and/or mobile device 534 may be used for a variety of display and interaction applications. The various applications include, but are not limited to, providing user interfaces (e.g., gaze-based selection), attention estimation (e.g., for user safety), gaze-contingent display modes (e.g., foveated rendering, varifocal optics, adaptive optical distortion correction, synthetic depth of field rendering), metric scaling for depth and parallax correction, etc. In some embodiments, a processor in the mobile device 534 may also provide computation for the eye tracker 504.

Passive sensors 506 may be cameras. Passive sensors may also be locators, which are objects located in specific positions on the NED 502 relative to one another and relative to a specific reference point on the NED 502. A locator may be a corner cube reflector, a reflective marker, a type of light source that contrasts with an environment in which the NED 502 operates, or some combination thereof. In embodiments in which the locators are active sensors 508 (i.e., an LED or other type of light emitting device), the locators may emit light in the visible band (~370 nm to 750 nm), in the infrared (IR) band (~750 nm to 1700 nm), in the ultraviolet band (300 nm to 380 nm), some other portion of the electromagnetic spectrum, or some combination thereof.

Based on the one or more measurement signals from the one or more position sensors 510, the IMU 512 generates IMU tracking data indicating an estimated position of the NED 502 relative to an initial position of the NED 502. For example, the position sensors 510 include multiple accelerometers to measure translational motion (forward/back, up/down, left/right) and multiple gyroscopes to measure rotational motion (e.g., pitch, yaw, and roll). In some embodiments, the IMU 512 rapidly samples the measurement signals and calculates the estimated position of the NED 502 from the sampled data. For example, the IMU 512 integrates the measurement signals received from the accelerometers over time to estimate a velocity vector and integrates the velocity vector over time to determine an estimated position of a reference point of the NED 502. Alternatively, the IMU 512 provides the sampled measurement signals to the neckband 514 and/or the mobile device 534 to process the computation required to estimate the velocity vector and the estimated position of the NED 502.

The IMU 512 may receive one or more calibration parameters from the bracelet 536, neckband 514 and/or the mobile device 534. The one or more calibration parameters are used to maintain tracking of the NED 502. Based on a received calibration parameter, the IMU 512 may adjust one or more IMU parameters (e.g., sample rate). The adjustment may be determined by the CPU 520 of the neckband 514, or a processor of the mobile device 534. In some embodiments, certain calibration parameters cause the IMU 512 to update an initial position of the reference point so it corresponds to a next calibrated position of the reference point. Updating the initial position of the reference point at the next calibrated position of the reference point helps reduce accumulated error associated with the determined estimated position of the NED 502. The accumulated error, also referred to as drift error, causes the estimated position of the reference point to "drift" away from the actual position of the reference point over time. In some examples, the IMU 512 is located in the neckband 514 or an IMU is present in both the neckband 514 and NED 502. In some examples, the IMU 512 receives position information from both position sensors 510 on the NED 502, positions sensors 538 on the bracelet 536 and position sensors 510 on the neckband (not shown).

As shown in FIG. 5, the neckband 514 includes an imaging device 310, power source 518, a CPU 520, a projector 526, user vitals monitor 528, a wireless gateway 530, imaging device 310 and activator 532. The audio unit 516, projector 526, user vitals monitor 528, imaging device 310 and activator 532 are optional components of the neckband 514. In some embodiments, the neckband 514 includes one or more multifunctional compartments that interface with various functional units. The functional units can include, e.g., an additional power source, an additional processing unit (e.g., CPU), the projector 526, the user vitals monitor 528, the wireless gateway 530, and the activator 532.

The imaging device 310 is optionally located on the neckband 514. In other embodiments of the system 500, the imaging device 310 may be located on the mobile device 534 or NED 502. The imaging device 310 is described in further detail with reference to FIG. 3.

The power source 518 provides power to the optical systems 135, eye tracker 504, passive sensors 506, active sensors 508, position sensors 510 and IMU 512. The power source 518 may be the battery compartment 155 as shown in FIG. 1. Power source 518 may be a rechargeable battery, which may be recharged by the mobile device 534. The power source 518 may be turned ON or OFF in response to an input of the activator 532, and/or a command received by the mobile device 534.

The CPU 520 may be any standard processor, and may be the processor embedded in the computation compartment 170 as shown in FIG. 1. The CPU 520 may provide all computational processing for the bracelet 536 and the NED 502, including the computation associated with the position sensors 538, IMU 540, cameras 542, magnetic sensors 544, eye tracker 504, passive sensors 506, active sensors 508, IMU 512. The CPU 520 may carry out calculations in parallel with the processor of the mobile device 534. A processor in the mobile device 534 may provide calculation results to the CPU 520.

The projector 526 may be located on the neckband 514 to project visual information to a user. The projector 526 may project visual information onto a surface in the user's field of view, or onto a coupled device with a screen, such as the mobile device 534.

The user vitals monitor 528 monitors vital signs and other user health indicators. Vital signs may be heart rate, pulse, estimated calorie consumption, number of steps taken by the user, the user's temperature, respiration rate, blood pressure, etc. The user vitals monitor 528 may be located in close proximity to a user's neck on the neckband 514, so that the vital signs may be accurate. For example, a pulse detection is more accurate if the vitals monitor is pressed firmly against the user's neck. The user vitals monitor 528 may be thermally isolated from the power source 518 and CPU 520 to ensure that temperature estimates are a result of the user's temperature and are unaffected by heat generated by the power source 518 and CPU 520. The user vitals monitor may be in communication with the position sensors 510 and IMU 512 to detect user steps and user movement to estimate the number of steps taken and/or calorie consumption.

The wireless gateway 530 provides signal communication with the mobile device 534, bracelet 536 and/or the NED 502. The wireless gateway 530 may convey the second signal 420 from the mobile device 405 to the neckband 115, as shown in FIG. 4. The wireless gateway 530 may convey the third signal 425 as shown in FIG. 4. The wireless gateway 530 may be any standard wireless signal gateway, such as a Bluetooth gateway, Wi-Fi gateway, etc.

The activator 532 controls functions on the bracelet 536, neckband 514, the NED 502, and/or the mobile device 534. The activator 532 may power ON or OFF any of the units in the bracelet 536, NED 502 and/or neckband 514.

The bracelet 536 includes position sensors 538, an IMU 540, cameras 542 and magnetic sensors 544. The bracelet 536 may include any additional passive or active sensors. The position sensors 538 produce signals in response to movement of the bracelet 536. In some examples, the position sensors 538 indicate a relative position between the bracelet 536 and any of the NED 502, neckband 514 and/or mobile device 534. The position sensors 538 may be the position sensor 120 and are described in further detail with respect to FIG. 1. The IMU 540 determines a position of the bracelet 536 using the signals produced by the position sensors 538. The IMU 540 is also described with respect to FIG. 1. The cameras 542 collect visual information about a user's hand to determine a user's hand gesture, such as hand gesture 330. The cameras 542 may be the camera 125, and are described in further detail with respect to FIG. 1. The magnetic sensors 544 produce a signal indicating the direction of a background magnetic field. Movement of the bracelet 536 produces a change in the relative position of the magnetic sensors 544 with respect to the magnetic field which can be used to determine a movement of the bracelet 105. Magnetic sensors 544 may be the magnetic sensors 130 and are described in further detail with respect to FIG. 1.

The distributed artificial reality system 500 produces an artificial reality environment to a user, or any combination thereof. The distributed artificial reality system 500 is able to distribute processing, power and heat generating functions across the bracelet 536, the NED 502, neckband 514 and mobile device 534. This allows each of bracelet 536, the NED 502 and neckband 514 to be adjusted to the desired weight and temperature for user comfort, as well as providing varied virtual environment interfaces and functions for the user to interact with at any of the bracelet 536, the NED 502, neckband 514 and/or mobile device 534.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A system comprising:
an eyewear device configured to present content to a user;
a processor communicatively coupled to the eyewear device;
a bracelet device communicatively coupled to the processor, the bracelet device comprising:
a first tracking sensor configured to determine a position signal in response to movement of the user's hand, and
a magnetometer configured to measure a gradient of a position of the bracelet device with respect to a magnetic field; and
wherein the processor determines a pose of the user's hand based in part on the position signal and determines a velocity of the user's hand based in part on the gradient and the position signal.

2. The system of claim 1, wherein:
the first tracking sensor is an accelerometer;
the position signal is a linear velocity; and
a rotational velocity of the user's hand is determined from the gradient and the linear velocity.

3. The system of claim 1, wherein:
the first tracking sensor is a gyroscope;
the position signal is a rotational velocity; and
a linear velocity of the user's hand is determined from the gradient and the rotational velocity.

4. The system of claim 1, wherein the eyewear device is further configured to change the content presented to the user in response to the pose of the user's hand.

5. The system of claim 1, wherein the processor uses a kinematic model to relate the position signal to the pose of the user's hand, and wherein the eyewear device changes the presented content to the user in response to the pose of the user's hand.

6. The system of claim 1, further comprising:
a depth camera assembly communicatively coupled to the processor, and configured to emit a waveform into an environment of the user and capture a plurality of optical signals from the waveform reflected off of at least one object in the environment, and wherein the processor relates the plurality of optical signals to the pose of the user's hand.

7. The system of claim 6, further comprising the neckband communicatively coupled to the bracelet device, and wherein the imaging device is located in the neckband.

8. A bracelet device comprising:
a first tracking sensor configured to determine a position signal in response to movement of a user's hand, and
a magnetometer configured to measure a gradient of a position of the bracelet device with respect to a magnetic field, the bracelet device communicatively coupled to a processor and an eyewear device, and configured to conform to a wrist of the user;
wherein the processor, communicatively coupled to the eyewear device, determines a pose of the user's hand based in part on the position signal and determines a velocity of the user's hand based in part on the gradient and the position signal; and
wherein the eyewear device is configured to change content presented to a user in response to the pose of the user's hand.

9. The bracelet device of claim 8, wherein:
the first tracking sensor is an accelerometer;
the position signal is a linear velocity; and
a rotational velocity of the user's hand is determined from the gradient and the linear velocity.

10. The bracelet device of claim 8, wherein:
the first tracking sensor is a gyroscope;
the position signal is a rotational velocity; and a linear velocity of the user's hand is determined from the gradient and the rotational velocity.

11. The bracelet device of claim 8, further comprising: a depth camera assembly communicatively coupled to the processor, and configured to emit a waveform into an environment of the user and capture a plurality of optical signals from the waveform reflected off of at least one object in the environment, and wherein the processor relates the plurality of optical signals to the pose of the user's hand.

12. The bracelet device of claim 11, further comprising the neckband communicatively coupled to the bracelet device, and wherein the imaging device is located in the neckband.

13. The bracelet device of claim 11, wherein the waveform is a structured light.

14. The bracelet device of claim 8, further comprising a neckband communicatively coupled to the bracelet device, and wherein the processor is located in the neckband.

15. A head-mounted display comprising:
an eyewear device configured to present content to a user;
a processor communicatively coupled to the eyewear device;
a bracelet device communicatively coupled to the processor, the bracelet device comprising:
    a first tracking sensor configured to determine a position signal in response to movement of the user's hand, and
    a magnetometer configured to measure a gradient of a position of the bracelet device with respect to a magnetic field; and
wherein the processor determines a pose of the user's hand based in part on the position signal and determines a velocity of the user's hand based in part on the gradient and the position signal.

16. The head-mounted display of claim 15, wherein:
the first tracking sensor is an accelerometer;
the position signal is a linear velocity; and
a rotational velocity of the user's hand is determined from the gradient and the linear velocity.

17. The head-mounted display of claim 15, wherein:
the first tracking sensor is a gyroscope;
the position signal is a rotational velocity; and
a linear velocity of the user's hand is determined from the gradient and the rotational velocity.

18. The head-mounted display of claim 15, wherein the eyewear device is further configured to change the content presented to the user in response to the pose of the user's hand.

19. The head-mounted display of claim 15, further comprising:
a depth camera assembly communicatively coupled to the processor, and configured to emit a waveform into an environment of the user and capture a plurality of optical signals from the waveform reflected off of at least one object in the environment, and wherein the processor relates the plurality of optical signals to the pose of the user's hand.

20. The head-mounted display of claim 15, further comprising the neckband communicatively coupled to the bracelet device, and wherein the depth camera assembly is located in the neckband.

* * * * *